US012505978B2

(12) United States Patent
Wieland

(10) Patent No.: US 12,505,978 B2
(45) Date of Patent: Dec. 23, 2025

(54) CHARGED PARTICLE ASSESSMENT TOOL, INSPECTION METHOD

(71) Applicant: ASML Netherlands B.V., Veldhoven (NL)

(72) Inventor: Marco Jan-Jaco Wieland, Delft (NL)

(73) Assignee: ASML Netherlands B.V., Veldhoven (NL)

( * ) Notice: Subject to any disclaimer, the term of this patent is extended or adjusted under 35 U.S.C. 154(b) by 564 days.

(21) Appl. No.: 17/891,983

(22) Filed: Aug. 19, 2022

(65) Prior Publication Data

US 2022/0392743 A1 Dec. 8, 2022

Related U.S. Application Data

(63) Continuation of application No. PCT/EP2021/053326, filed on Feb. 11, 2021.

(30) Foreign Application Priority Data

Feb. 21, 2020 (EP) .................................... 20158804
Nov. 11, 2020 (EP) .................................... 20206984

(51) Int. Cl.
*H01J 37/28* (2006.01)
*H01J 37/12* (2006.01)
*H01J 37/317* (2006.01)

(52) U.S. Cl.
CPC .............. *H01J 37/28* (2013.01); *H01J 37/12* (2013.01); *H01J 37/3177* (2013.01)

(58) Field of Classification Search
CPC .. H01J 37/00; H01J 37/02; H01J 37/26; H01J 37/28; H01J 37/12; H01J 37/3177;
(Continued)

(56) References Cited

U.S. PATENT DOCUMENTS 6,703,624 B2 3/2004 Hamaguchi et al.
7,453,075 B2 11/2008 Kruit
(Continued)

FOREIGN PATENT DOCUMENTS

CN 107112183 A 8/2017
CN 109216143 A 1/2019
(Continued)

OTHER PUBLICATIONS

International Search Report received from the International Search Authority issued in related International Application No. PCT/EP2021/053326 mailed Jun. 18, 2021 (3 pgs.).
(Continued)

*Primary Examiner* — Jason L Mccormack
(74) *Attorney, Agent, or Firm* — Finnegan, Henderson, Farabow, Garrett & Dunner, LLP

(57) ABSTRACT

A charged-particle assessment tool comprising: a condenser lens array, a collimator, a plurality of objective lenses and an electric power source. The condenser lens array configured to divide a beam of charged particles into a plurality of sub-beams and to focus each of the sub-beams to a respective intermediate focus. The collimator being at each intermediate focus and configured to deflect a respective sub-beam so that it is incident on the sample substantially normally. The plurality of objective lenses, each configured to project one of the plurality of charged-particle beams onto a sample. Each objective lens comprises: a first electrode; and a second electrode that is between the first electrode and the sample. The electric power source configured to apply first and second potentials to the first and second electrodes
(Continued)

respectively such that the respective charged-particle beam is decelerated to be incident on the sample with a desired landing energy.

19 Claims, 5 Drawing Sheets

(58) Field of Classification Search
CPC ..... H01J 2237/0453; H01J 2237/04756; H01J 2237/04924; H01J 2237/2817
USPC .............................. 250/504 R, 306, 307, 311
See application file for complete search history.

(56) References Cited

U.S. PATENT DOCUMENTS

| | | | | |
|---|---|---|---|---|
| 8,785,879 | B1 | 7/2014 | Frosien | |
| 9,922,796 | B1 | 3/2018 | Frosien et al. | |
| 10,312,052 | B2 | 6/2019 | Kruit | |
| 10,453,645 | B2 | 10/2019 | Frosien et al. | |
| 2006/0169898 | A1 | 8/2006 | Muraki et al. | |
| 2008/0283744 | A1 | 11/2008 | Takada et al. | |
| 2010/0133433 | A1 | 6/2010 | Tanimoto et al. | |
| 2010/0276606 | A1 | 11/2010 | Baars et al. | |
| 2013/0277554 | A1* | 10/2013 | Ren | H01J 37/261 250/310 |
| 2014/0014852 | A1* | 1/2014 | Wieland | B82Y 10/00 250/396 R |
| 2014/0264062 | A1 | 9/2014 | Adamec | |
| 2017/0243717 | A1* | 8/2017 | Kruit | H01J 37/12 |
| 2019/0013176 | A1 | 1/2019 | Breuer | |
| 2019/0259570 | A1 | 8/2019 | Kruit et al. | |
| 2020/0051779 | A1* | 2/2020 | Ren | H01J 37/1474 |

FOREIGN PATENT DOCUMENTS

| | | | |
|---|---|---|---|
| EP | 0422414 | A1 | 4/1991 |
| JP | H03241650 | A | 10/1991 |
| JP | 2004235062 | A | 8/2004 |
| JP | 2005-203464 | A | 7/2005 |
| JP | 2008181786 | A | 8/2008 |
| JP | 2013165234 | A | 8/2013 |
| JP | 2014-183047 | A | 9/2014 |
| JP | 2014-220241 | A | 11/2014 |
| JP | 2017-162590 | A | 9/2017 |
| WO | WO 2018/099756 | A1 | 6/2018 |
| WO | WO 2019063559 | A1 | 4/2019 |
| WO | WO 2019/147872 | A2 | 8/2019 |

OTHER PUBLICATIONS

Office Action issued by the Intellectual Property Office (IPO), ROC (Taiwan) Patent Application No. 110105897, issued on Oct. 29, 2021 (15 pgs.).

H. M. P. van Himbergen, et al., "High through put defect detection with multiple parallel electron beams," Journal of Vacuum Science & Technology B: vol. 25, No. 6, pp. 2521-2525.

Zhang Y. et al.: "Design of a high brightness multi-electron-beam source," ScienceDirect Physics Procedia 1 (2008) 553-563 (11 pgs.).

Notice of Reasons for Rejection issued by the Japan Patent Office in related Japanese Patent Application No. 2022-545974; mailed Jul. 19, 2023 (17 pgs.).

* cited by examiner

CHARGED PARTICLE ASSESSMENT TOOL, INSPECTION METHOD

CROSS-REFERENCE TO RELATED APPLICATIONS

This application claims priority of International application PCT/EP2021/053326, which was filed on 11 Feb. 2021, which claims priority of EP application 20158804.3, which was filed on 21 Feb. 2020, and EP application 20206984.5, which was filed on 11 Nov. 2020, all of which are each incorporated herein by reference in their entireties.

FIELD

The embodiments provided herein generally relate to a charged particle assessment tools and inspection methods, and particularly to charged particle assessment tools and inspection methods that use multiple sub-beams of charged particles.

BACKGROUND

When manufacturing semiconductor integrated circuit (IC) chips, undesired pattern defects, as a consequence of, for example, optical effects and incidental particles, inevitably occur on a substrate (i.e., wafer) or a mask during the fabrication processes, thereby reducing the yield. Monitoring the extent of the undesired pattern defects is therefore an important process in the manufacture of IC chips. More generally, the inspection and/or measurement of a surface of a substrate, or other object/material, is an important process during and/or after its manufacture.

Pattern inspection tools with a charged particle beam have been used to inspect objects, for example to detect pattern defects. These tools typically use electron microscopy techniques, such as a scanning electron microscope (SEM). In a SEM, a primary electron beam of electrons at a relatively high energy is targeted with a final deceleration step in order to land on a sample at a relatively low landing energy. The beam of electrons is focused as a probing spot on the sample. The interactions between the material structure at the probing spot and the landing electrons from the beam of electrons cause electrons to be emitted from the surface, such as secondary electrons, backscattered electrons or Auger electrons. The generated secondary electrons may be emitted from the material structure of the sample. By scanning the primary electron beam as the probing spot over the sample surface, secondary electrons can be emitted across the surface of the sample. By collecting these emitted secondary electrons from the sample surface, a pattern inspection tool may obtain an image representing characteristics of the material structure of the surface of the sample.

There is a general need to improve the throughput and other characteristics of a charged particle inspection apparatus.

SUMMARY

The embodiments provided herein disclose a charged particle beam inspection apparatus.

According to some embodiments of the present disclosure, there is provided a charged-particle assessment tool comprising:

- a condenser lens array configured to divide a beam of charged particles into a plurality of sub-beams and to focus each of the sub-beams to a respective intermediate focus.

- a collimator at each intermediate focus, the collimators being configured to deflect a respective sub-beam so that it is incident on the sample substantially normally;
- a plurality of objective lenses, each configured to project one of the plurality of charged-particle beams onto a sample, wherein:
- each objective lens comprises:
  - a first electrode; and
  - a second electrode that is between the first electrode and the sample; and
- an electric power source configured to apply first and second potentials to the first and second electrodes respectively such that the respective charged-particle beam is decelerated to be incident on the sample with a desired landing energy According to some embodiments of the present disclosure, there is provided an inspection method comprising:

- dividing a beam of charged particles into a plurality of sub-beams;
- focusing each of the sub-beams to a respective intermediate focus.
- using a collimator at each intermediate focus to deflect a respective sub-beam so that it is incident on the sample substantially normally; and
- using a plurality of objective lenses to project the plurality of charged-particle beams onto the sample, each objective lens comprising a first electrode and a second electrode that is between the first electrode and the sample; and
- controlling electric potentials applied to the first and second electrodes of each objective lens such that the respective charged-particle beam is decelerated to be incident on the sample with a desired landing energy.

According to some embodiments of the present disclosure, there is provided multi-beam charged-particle-optical system comprising:

- a condenser lens array configured to divide a beam of charged particles into a plurality of sub-beams and to focus each of the sub-beams to a respective intermediate focus.
- a collimator at each intermediate focus, the collimators being configured to deflect a respective sub-beam so that it is incident on the sample substantially normally;
- a plurality of objective lenses, each configured to project one of the plurality of charged particle beams onto a sample, wherein:
- each objective lens comprises:
  - a first electrode; and
  - a second electrode that is between the first electrode and the sample; and
- an electric power source configured to apply first and second potentials to the first and second electrodes respectively such that the respective charged-particle beam is decelerated to be incident on the sample with a desired landing energy.

According to some embodiments of the present disclosure, there is provided a last charged-particle-optical element for a multi-beam projection system configured to project a plurality of charged particle beams onto a sample, the last charged-particle-optical element comprising:

- a plurality of objective lenses, each configured to project one of the plurality of charged particle beams onto a sample, wherein:

each objective lens comprises:

a first electrode; and a second electrode that is between the first electrode and the sample; and an electric power source configured to apply first and second potentials to the first and second electrodes respectively such that the respective charged-particle beam is decelerated to be incident on the sample with a desired landing energy.

BRIEF DESCRIPTION OF FIGURES

The above and other aspects of the present disclosure will become more apparent from the description of exemplary embodiments, taken in conjunction with the accompanying drawings.

DETAILED DESCRIPTION

Figure 1:
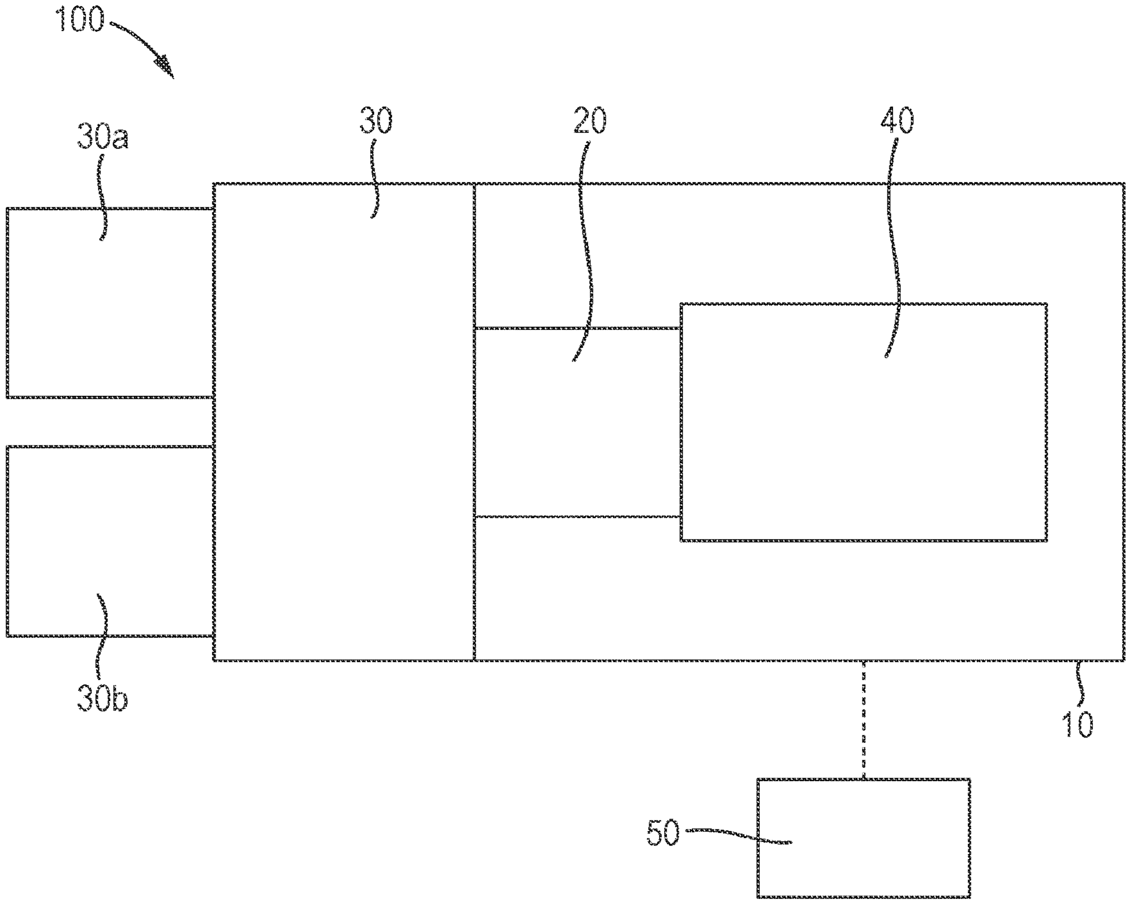
FIG. 1 is a schematic diagram illustrating an exemplary charged particle beam inspection apparatus.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of apparatuses and methods consistent with aspects related to the invention as recited in the appended claims.

The enhanced computing power of electronic devices, which reduces the physical size of the devices, can be accomplished by significantly increasing the packing density of circuit components such as transistors, capacitors, diodes, etc. on an IC chip. This has been enabled by increased resolution enabling yet smaller structures to be made. For example, an IC chip of a smart phone, which is the size of a thumbnail and available in, or earlier than, 2019, may include over 2 billion transistors, the size of each transistor being less than 1/1000th of a human hair. Thus, it is not surprising that semiconductor IC manufacturing is a complex and time-consuming process, with hundreds of individual steps. Errors in even one step have the potential to dramatically affect the functioning of the final product. Just one "killer defect" can cause device failure. The goal of the manufacturing process is to improve the overall yield of the process. For example, to obtain a 75% yield for a 50-step process (where a step can indicate the number of layers formed on a wafer), each individual step must have a yield greater than 99.4%. If each individual step had a yield of 95%, the overall process yield would be as low as 7%.

While high process yield is desirable in an IC chip manufacturing facility, maintaining a high substrate (i.e., wafer) throughput, defined as the number of substrates processed per hour, is also essential. High process yield and high substrate throughput can be impacted by the presence of a defect. This is especially if operator intervention is required for reviewing the defects. Thus, high throughput detection and identification of micro and nano-scale defects by inspection tools (such as a Scanning Electron Microscope ('SEM')) is essential for maintaining high yield and low cost.

A SEM comprises a scanning device and a detector apparatus. The scanning device comprises an illumination apparatus that comprises an electron source, for generating primary electrons, and a projection apparatus for scanning a sample, such as a substrate, with one or more focused beams of primary electrons. Together at least the illumination apparatus, or illumination system, and the projection apparatus, or projection system, may be referred to together as the electron-optical system or apparatus. The primary electrons interact with the sample and generate secondary electrons. The detection apparatus captures the secondary electrons from the sample as the sample is scanned so that the SEM can create an image of the scanned area of the sample. For high throughput inspection, some of the inspection apparatuses use multiple focused beams, i.e., a multi-beam, of primary electrons. The component beams of the multi-beam may be referred to as sub-beams or beamlets. A multi-beam can scan different parts of a sample simultaneously. A multi-beam inspection apparatus can therefore inspect a sample at a much higher speed than a single-beam inspection apparatus.

An implementation of a known multi-beam inspection apparatus is described below.

The figures are schematic. Relative dimensions of components in drawings are therefore exaggerated for clarity. Within the following description of drawings, the same or like reference numbers refer to the same or like components or entities, and only the differences with respect to the individual embodiments are described. While the description and drawings are directed to an electron-optical apparatus, it is appreciated that the embodiments are not used to limit the present disclosure to specific charged particles. References to electrons throughout the present document may therefore be more generally be considered to be references to charged particles, with the charged particles not necessarily being electrons.

Reference is now made to FIG. 1, which is a schematic diagram illustrating an exemplary charged particle beam inspection apparatus 100. The charged particle beam inspection apparatus 100 of FIG. 1 includes a main chamber 10, a load lock chamber 20, an electron beam tool 40, an equipment front end module (EFEM) 30 and a controller 50. Electron beam tool 40 is located within main chamber 10.

EFEM 30 includes a first loading port **30*a* and a second loading port 30*b*. EFEM 30 may include additional loading port(s). First loading port 30*a* and second loading port 30*b* may, for example, receive substrate front opening unified pods (FOUPs) that contain substrates (e.g., semiconductor substrates or substrates made of other material(s)) or samples to be inspected (substrates, wafers and samples are collectively referred to as "samples" hereafter). One or more robot arms (not shown) in EFEM 30 transport the samples to load lock chamber 20**.

Load lock chamber 20 is used to remove the gas around a sample. This creates a vacuum that is a local gas pressure lower than the pressure in the surrounding environment. The load lock chamber 20 may be connected to a load lock vacuum pump system (not shown), which removes gas particles in the load lock chamber 20. The operation of the load lock vacuum pump system enables the load lock chamber to reach a first pressure below the atmospheric pressure. After reaching the first pressure, one or more robot arms (not shown) transport the sample from load lock chamber 20 to main chamber 10. Main chamber 10 is connected to a main chamber vacuum pump system (not shown). The main chamber vacuum pump system removes gas particles in main chamber 10 so that the pressure in around the sample reaches a second pressure lower than the first pressure. After reaching the second pressure, the sample is transported to the electron beam tool by which it may be inspected. An electron beam tool 40 may comprise a multi-beam electron-optical apparatus.

Controller 50 is electronically connected to electron beam tool 40. Controller 50 may be a processor (such as a computer) configured to control the charged particle beam inspection apparatus 100. Controller 50 may also include a processing circuitry configured to execute various signal and image processing functions. While controller 50 is shown in FIG. 1 as being outside of the structure that includes main chamber 10, load lock chamber 20, and EFEM 30, it is appreciated that controller 50 may be part of the structure. The controller 50 may be located in one of the component elements of the charged particle beam inspection apparatus or it can be distributed over at least two of the component elements. While the present disclosure provides examples of main chamber 10 housing an electron beam inspection tool, it should be noted that aspects of the disclosure in their broadest sense are not limited to a chamber housing an electron beam inspection tool. Rather, it is appreciated that the foregoing principles may also be applied to other tools and other arrangements of apparatus, that operate under the second pressure.

Figure 2:
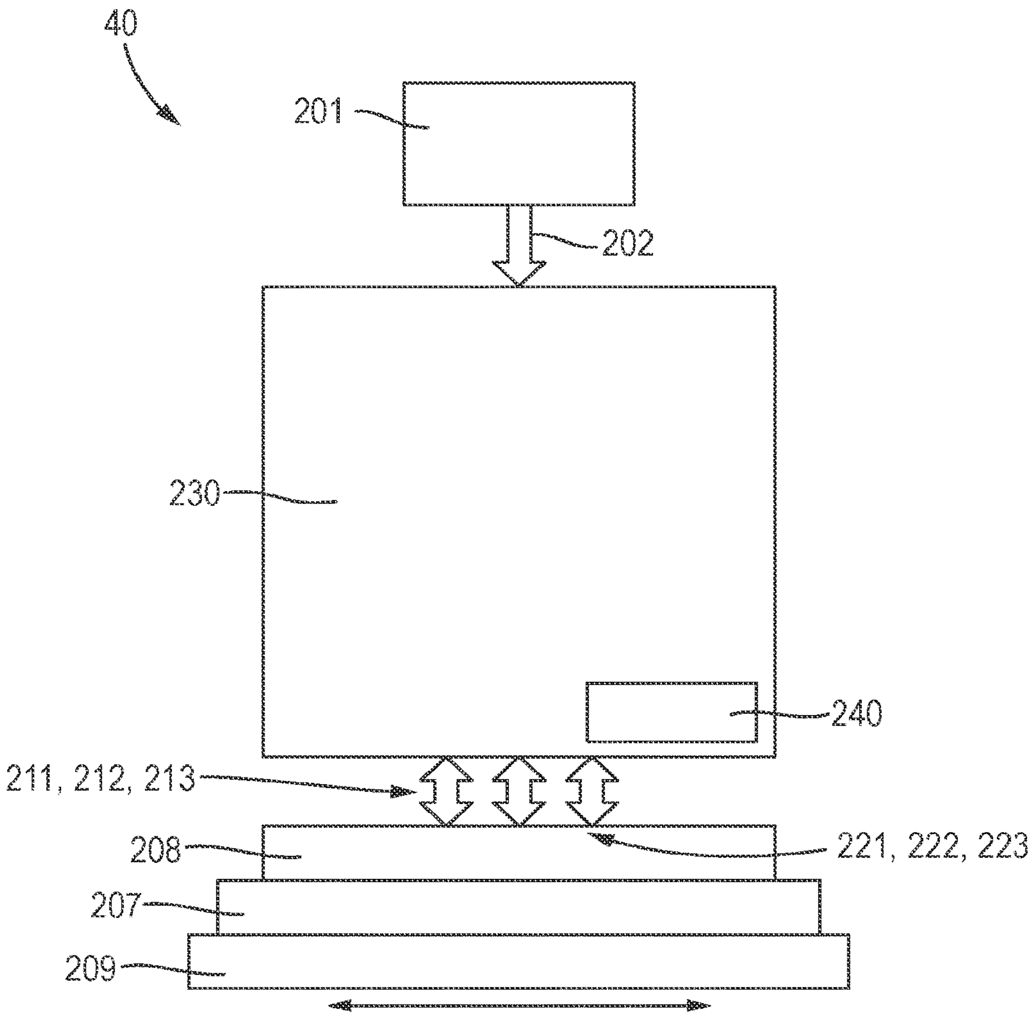
FIG. 2 is a schematic diagram illustrating an exemplary multi-beam apparatus that is part of the exemplary charged particle beam inspection apparatus of FIG. 1.

Reference is now made to FIG. 2, which is a schematic diagram illustrating an exemplary electron beam tool 40 including a multi-beam inspection tool that is part of the exemplary charged particle beam inspection apparatus 100 of FIG. 1. Multi-beam electron beam tool 40 (also referred to herein as apparatus 40) comprises an electron source 201, a projection apparatus 230, a motorized stage 209, and a sample holder 207. The electron source 201 and projection apparatus 230 may together be referred to as an illumination apparatus. The sample holder 207 is supported by motorized stage 209 so as to hold a sample 208 (e.g., a substrate or a mask) for inspection. Multi-beam electron beam tool 40 further comprises an electron detection device 240.

Electron source 201 may comprise a cathode (not shown) and an extractor or anode (not shown). During operation, electron source 201 is configured to emit electrons as primary electrons from the cathode. The primary electrons are extracted or accelerated by the extractor and/or the anode to form a primary electron beam 202.

Projection apparatus 230 is configured to convert primary electron beam 202 into a plurality of sub-beams 211, 212, 213 and to direct each sub-beam onto the sample 208. Although three sub-beams are illustrated for simplicity, there may be many tens, many hundreds or many thousands of sub-beams. The sub-beams may be referred to as beamlets.

Controller 50 may be connected to various parts of charged particle beam inspection apparatus 100 of FIG. 1, such as electron source 201, electron detection device 240, projection apparatus 230, and motorized stage 209. Controller 50 may perform various image and signal processing functions. Controller 50 may also generate various control signals to govern operations of the charged particle beam inspection apparatus, including the charged particle multi-beam apparatus.

Projection apparatus 230 may be configured to focus sub-beams 211, 212, and 213 onto a sample 208 for inspection and may form three probe spots 221, 222, and 223 on the surface of sample 208. Projection apparatus 230 may be configured to deflect primary sub-beams 211, 212, and 213 to scan probe spots 221, 222, and 223 across individual scanning areas in a section of the surface of sample 208. In response to incidence of primary sub-beams 211, 212, and 213 on probe spots 221, 222, and 223 on sample 208, electrons are generated from the sample 208 which include secondary electrons and backscattered electrons. The secondary electrons typically have electron energy ≤50 eV and backscattered electrons typically have electron energy between 50 eV and the landing energy of primary sub-beams 211, 212, and 213.

Electron detection device 240 is configured to detect secondary electrons and/or backscattered electrons and to generate corresponding signals which are sent to controller 50 or a signal processing system (not shown), e.g., to construct images of the corresponding scanned areas of sample 208. Electron detection device may be incorporated into the projection apparatus or may be separate therefrom, with a secondary optical column being provided to direct secondary electrons and/or backscattered electrons to the electron detection device.

The controller 50 may comprise image processing system that includes an image acquirer (not shown) and a storage device (not shown). For example, the controller may comprise a processor, computer, server, mainframe host, terminals, personal computer, any kind of mobile computing devices, and the like, or a combination thereof. The image acquirer may comprise at least part of the processing function of the controller. Thus, the image acquirer may comprise at least one or more processors. The image acquirer may be communicatively coupled to an electron detection device 240 of the apparatus 40 permitting signal communication, such as an electrical conductor, optical fiber cable, portable storage media, IR, Bluetooth, internet, wireless network, wireless radio, among others, or a combination thereof. The image acquirer may receive a signal from electron detection device 240, may process the data comprised in the signal and may construct an image therefrom. The image acquirer may thus acquire images of sample 208. The image acquirer may also perform various post-processing functions, such as generating contours, superimposing indicators on an acquired image, and the like. The image acquirer may be configured to perform adjustments of brightness and contrast, etc. of acquired images. The storage may be a storage medium such as a hard disk, flash drive, cloud storage, random access memory (RAM), other types of computer readable memory, and the like. The storage may be coupled with the image acquirer and may be used for saving scanned raw image data as original images, and post-processed images.

The image acquirer may acquire one or more images of a sample based on an imaging signal received from the electron detection device 240. An imaging signal may correspond to a scanning operation for conducting charged particle imaging. An acquired image may be a single image comprising a plurality of imaging areas. The single image may be stored in the storage. The single image may be an original image that may be divided into a plurality of regions. Each of the regions may comprise one imaging area containing a feature of sample 208. The acquired images may comprise multiple images of a single imaging area of sample 208 sampled multiple times over a time period. The multiple images may be stored in the storage. The controller 50 may be configured to perform image processing steps with the multiple images of the same location of sample 208.

The controller 50 may include measurement circuitry (e.g., analog-to-digital converters) to obtain a distribution of the detected secondary electrons. The electron distribution data, collected during a detection time window, can be used in combination with corresponding scan path data of each of primary sub-beams 211, 212, and 213 incident on the sample surface, to reconstruct images of the sample structures under inspection. The reconstructed images can be used to reveal various features of the internal or external structures of sample 208. The reconstructed images can thereby be used to reveal any defects that may exist in the sample.

The controller 50 may control motorized stage 209 to move sample 208 during inspection of sample 208. The controller 50 may enable motorized stage 209 to move sample 208 in a direction, preferably continuously, for example at a constant speed, at least during sample inspection. The controller 50 may control movement of the motorized stage 209 so that it changes the speed of the movement of the sample 208 dependent on various parameters. For example, the controller may control the stage speed (including its direction) depending on the characteristics of the inspection steps of scanning process.

Figure 3:
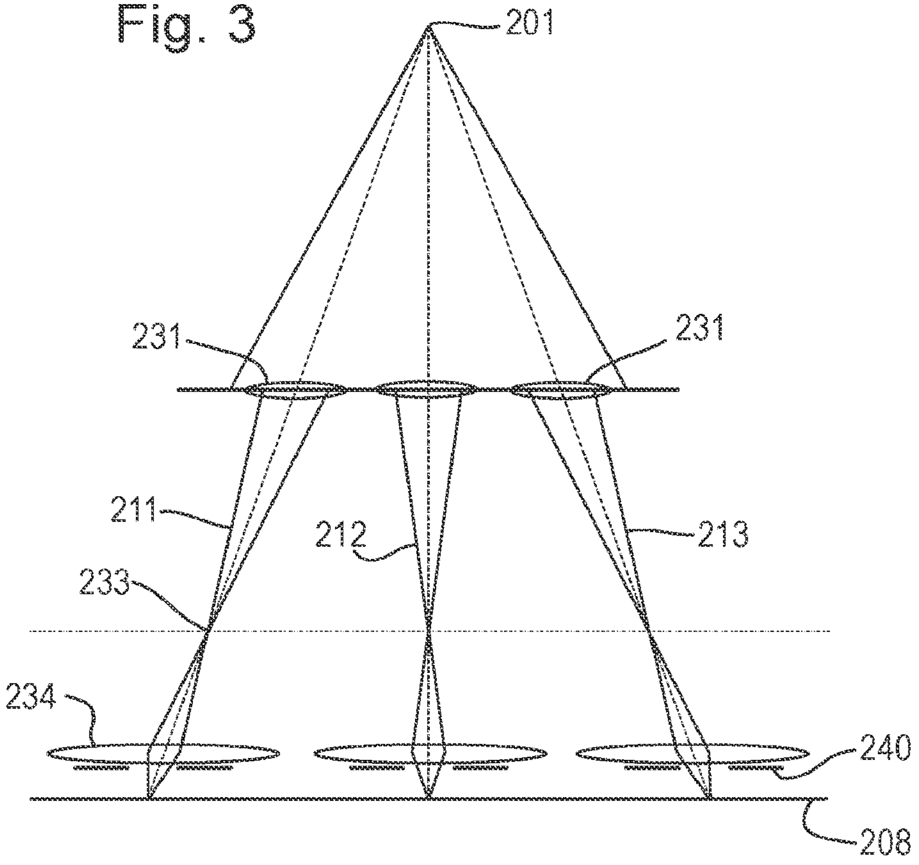
FIG. 3 is a schematic diagram of exemplary multi-beam apparatus, according to some embodiments of the present disclosure.

FIG. 3 is a schematic diagram of an assessment tool. Electron source 201 directs electrodes toward an array of condenser lenses 231 forming part of projection system 230. The electron source is desirably a high brightness thermal field emitter with a good compromise between brightness and total emission current. There may be many tens, many hundreds or many thousands of condenser lenses 231. Condenser lenses 231 may comprise multi-electrode lenses and have a construction based on EP1602121A1, which document is hereby incorporated by reference in particular to the disclosure of a lens array to split an e-beam into a plurality of sub-beams, with the array providing a lens for each sub-beam. The lens array may take the form of at least two plates. The lens array may comprise a beam limiting aperture array which may be one of the at least two plates. The at least two plates act as electrodes, with an aperture in each plate aligned with each other and corresponding to the location of a sub-beam. At least two of the plates are maintained during operation at different potentials to achieve the desired lensing effect.

In an arrangement the condenser lens array is formed of three plate arrays in which charged particles have the same energy as they enter and leave each lens, which arrangement may be referred to as an Einzel lens. Thus, dispersion only occurs within the Einzel lens itself (between entry and exit electrodes of the lens), thereby limiting off-axis chromatic aberrations. When the thickness of the condenser lenses is low, e.g., a few mm, such aberrations have a small or negligible effect.

Each condenser lens in the array directs electrons into a respective sub-beam 211, 212, 213 which is focused at a respective intermediate focus 233. The sub-beams diverge with respect to each other. Downbeam of the intermediate focuses 233 are a plurality of objective lenses 234, each of which directs a respective sub-beam 211, 212, 213 onto the sample 208. The objective lenses 234 may be Einzel lenses. At least the chromatic aberrations generated in a beam by a condenser lens and the corresponding downbeam objective lens may mutually cancel.

An electron detection device 240 is provided between the objective lenses 234 and the sample 208 to detect secondary and/or backscattered electrons emitted from the sample 208. An exemplary construction of the electron detection system is described below.

Figure 4:
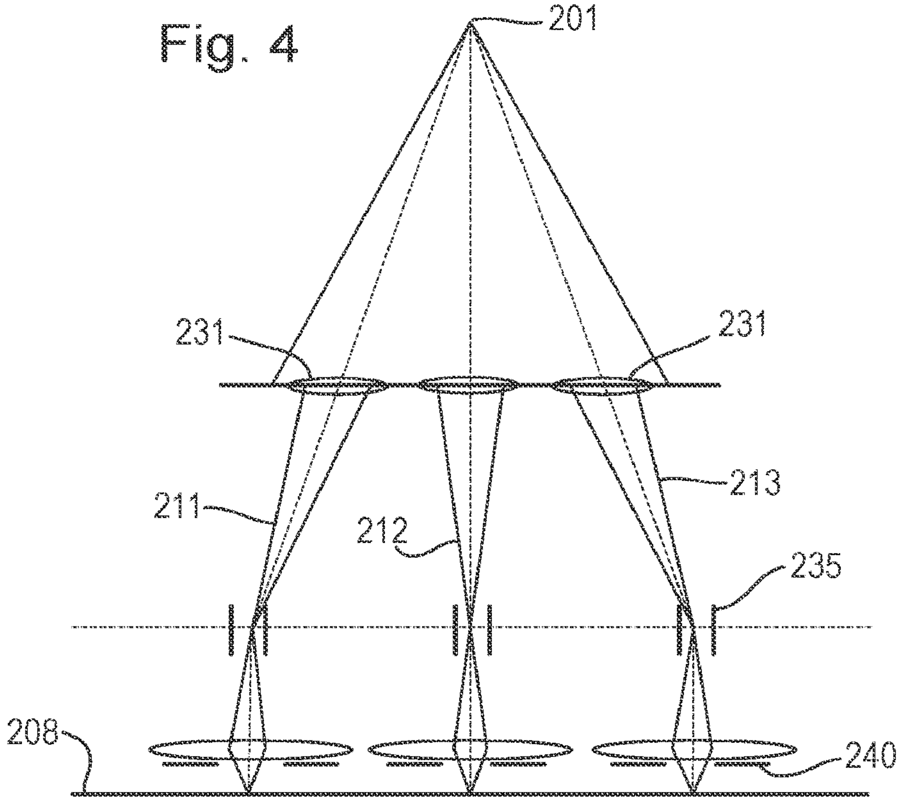
FIG. 4 is a schematic diagram of another exemplary multi-beam apparatus, according to some embodiments of the present disclosure.

In the system of FIG. 3, the beamlets 211, 212, 213 propagate along straight paths from the condenser lenses 231 to the sample 208. The beamlet paths diverge down beam of the condenser lenses 231. A variant system is shown in FIG. 4 which is the same as the system of FIG. 3 except that deflectors 235 are provided at the intermediate focuses 233. The deflectors 235 are positioned in the beamlet paths at, or at least around, the position of the corresponding intermediate focusses 233 or focus points (i.e., points of focus). The deflectors are positioned in the beamlet paths at the intermediate image plane of the associated beamlet, i.e., at its focus or focus point. The deflectors 235 are configured to operate on the respective beamlets 211, 212, 213. Deflectors 235 are configured to bend a respective beamlet 211, 212, 213 by an amount effective to ensure that the principal ray (which may also be referred to as the beam axis) is incident on the sample 208 substantially normally (i.e., at substantially 90° to the nominal surface of the sample). Deflectors 235 may also be referred to as collimators or collimator deflectors. The deflectors 235 in effect collimate the paths of the beamlets so that before the deflectors, the beamlets paths with respect to each other are diverging. Down beam of the deflectors the beamlet paths are substantially parallel with respect to each other, i.e., substantially collimated. Thus, each beamlet path may be in a straight line between the array of condenser lenses 231 and the collimator e.g. the array of deflectors 235. Each beamlet path may be in a straight line between the array of deflectors 235 and the objective lens array 234 and optionally the sample 208. Suitable collimators are deflectors disclosed in EP Application 20156253.5 filed on 7 Feb. 2020 which is hereby incorporated by reference with respect to the application of the deflectors to a multi-beam array.

The system of FIG. 4 can be configured to control the landing energy of the electrons on the sample. The landing energy can be selected to increase emission and detection of secondary electrons dependent on the nature of the sample being assessed. A controller provided to control the objective lenses 234 may be configured to control the landing energy to any desired value within a predetermined range or to a desired one of a plurality of predetermined values. In some embodiments, the landing energy can be controlled to desired value in the range of from 1000 eV to 5000 eV. The landing energy of the electrons may be controlled in the system of FIG. 4 because any off-axis aberrations generated in the beamlet path are generated in, or at least mainly in, the condenser lenses 231. The objective lenses 234 of the system shown in FIG. 4 need not be Einzel lenses. This is because if the beams are collimated the off-axis aberrations would not be generated in the objective lenses. The off-axis aberrations can be controlled better in the condenser lenses than in the objective lenses 234. By making the condenser lenses 231 substantially thinner the contributions of the condenser lenses to the off-axis aberrations, specifically the chromatic off-axis aberrations, may be minimized. The thickness of the condenser lens 231 may be varied to tune the chromatic off-axis contribution balancing other contributions of the chromatic aberrations in the respective beamlet paths. Thus the objective lenses 234 may have two or more electrodes. The beam energy on entering an objective lens can be different from its energy leaving the objective lens.

Figure 6:
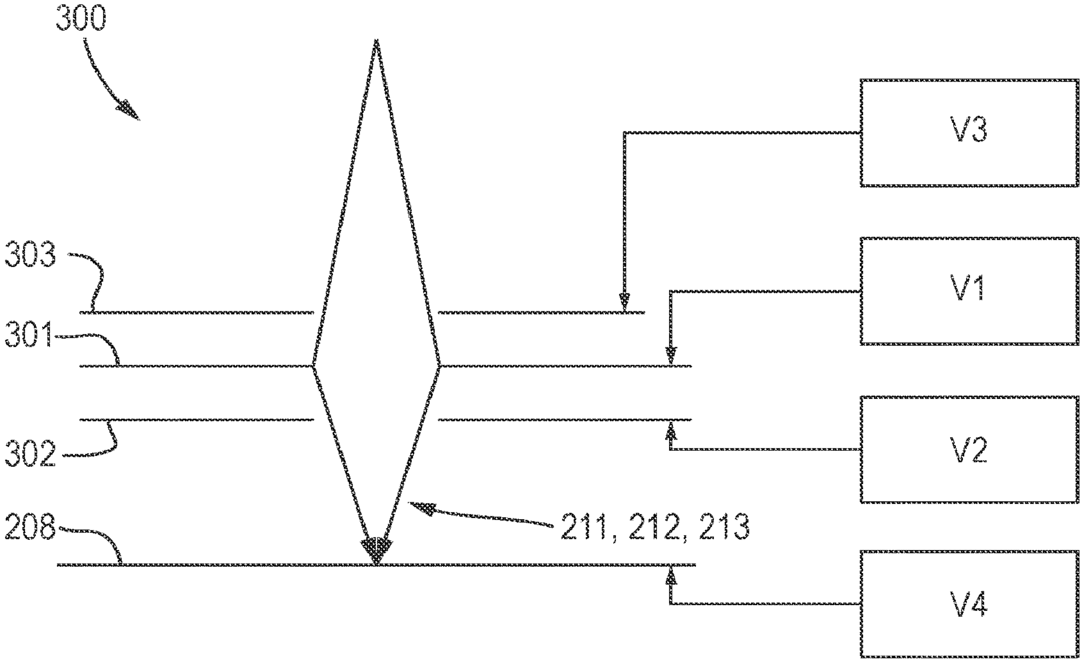
FIG. 6 is an enlarged diagram of an objective lens, according to some embodiments of the present disclosure.

FIG. 6 is an enlarged schematic view of one objective lens 300 of the array of objective lenses. Objective lens 300 can be configured to demagnify the electron beam by a factor greater than 10, desirably in the range of 50 to 100 or more. The objective lens comprises a middle or first electrode 301, a lower or second electrode 302 and an upper or third electrode 303. Voltage sources V1, V2, V3 are configured to apply potentials to the first second and third electrodes respectively. A further voltage source V4 is connected to the sample to apply a fourth potential, which may be ground. Potentials can be defined relative to the sample 208. The first, second and third electrodes are each provided with an aperture through which the respective sub-beam propagates. The second potential can be similar to the potential of the sample, e.g., in the range of from 50 V to 200 V more positive. Alternatively, the second potential can be in the range of from about +500 V to about +1,500 V. A higher potential is useful if the detector is higher in the optical column than the lowest electrode. The first and/or second potentials can be varied per aperture or group of apertures to effect focus corrections.

Desirably, in some embodiments, the third electrode is omitted. An objective lens having only two electrodes can have lower aberration than an objective lens having more electrodes. A three-electrode objective lens can have greater potential differences between the electrodes and so enable a stronger lens. Additional electrodes (i.e., more than two electrodes) provides additional degrees for freedom for controlling the electron trajectories, e.g. to focus secondary electrodes as well as the incident beam.

To provide the objective lens 300 with a decelerating function, so that the landing energy can be determined, it is desirable to change the potential of the lowest electrode and the sample. To decelerate the electrons the lower (second) electrode is made more negative than the central electrode. The highest electrostatic field strength occurs when the lowest landing energy is selected. The distance between the second electrode and middle electrode, lowest landing energy and maximum potential difference between second electrode and middle electrode are selected so that the resulting field strength is acceptable. For higher landing energies, the electrostatic field becomes lower (less deceleration over the same length).

Figure 5:
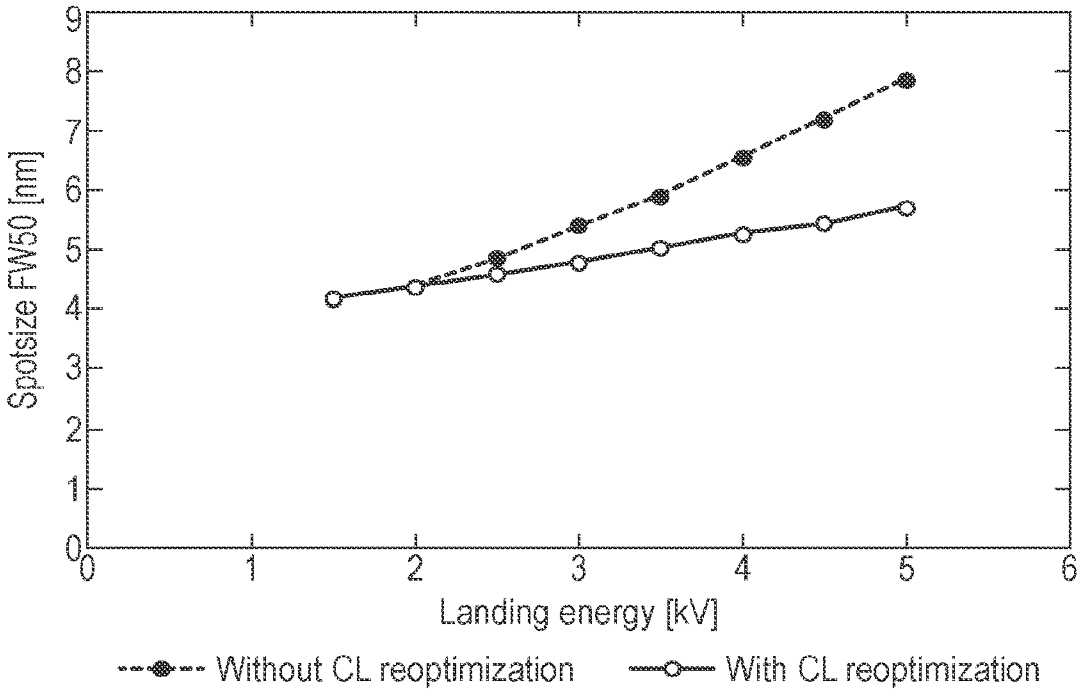
FIG. 5 is a graph of landing energy vs. spot size.

Because the electron optics configuration between the electron source and beam limiting aperture (just above the condenser lens) remain the same, the beam current remains unchanged with changes in landing energy. Changing the landing energy can affect resolution, either to improve or reduce it. FIG. 5 is a graph showing landing energy vs. spot size in two cases. The dashed line with solid circles indicates the effect of changing only the landing energy, i.e., the condenser lens voltage remains the same. The solid line with open circles indicates the effect if the landing energy is changed and condenser lens voltage (magnification versus opening angle optimization) is reoptimized.

If the condenser lens voltage is changed, the collimator will not be in the precise intermediate image plane for all landing energies. Therefore, it is desirable to correct the astigmatism induced by the collimator.

In some embodiments, the charged particle assessment tool further comprises one or more aberration correctors that reduce one or more aberrations in the sub-beams. In some embodiments, each of at least a subset of the aberration correctors is positioned in, or directly adjacent to, a respective one of the intermediate foci (e.g., in or adjacent to the intermediate image plane). The sub-beams have the smallest sectional area in or near a focal plane such as the intermediate plane. This provides more space for aberration correctors than is available elsewhere, i.e., upbeam or downbeam of the intermediate plane (or than would be available in alternative arrangements that do not have an intermediate image plane).

In some embodiments, aberration correctors positioned in, or directly adjacent to, the intermediate foci (or intermediate image plane or focus points) comprise deflectors to correct for the source 201 appearing to be at different positions for different beams. Correctors can be used to correct macroscopic aberrations resulting from the source that prevent a good alignment between each sub-beam and a corresponding objective lens.

The aberration correctors may correct aberrations that prevent a proper column alignment. Such aberrations may also lead to a misalignment between the sub-beams and the correctors. For this reason, it may be desirable to additionally or alternatively position aberration correctors at or near the condenser lenses 231 (e.g., with each such aberration corrector being integrated with, or directly adjacent to, one or more of the condenser lenses 231). This is desirable because at or near the condenser lenses 231 aberrations will not yet have led to a shift of corresponding sub-beams because the condenser lenses 231 are vertically close or coincident with the beam apertures. A challenge with positioning correctors at or near the condenser lenses 231, however, is that the sub-beams each have relatively large sectional areas and relatively small pitch at this location, relative to locations further downstream.

In some embodiments, each of at least a subset of the aberration correctors is integrated with, or directly adjacent to, one or more of the objective lenses 234. In some embodiments, these aberration correctors reduce one or more of the following: field curvature; focus error; and astigmatism. Additionally or alternatively, one or more scanning deflectors (not shown) may be integrated with, or directly adjacent to, one or more of the objective lenses 234 for scanning the sub-beams 211, 212, 214 over the sample 208. In some embodiments, the scanning deflectors described in US 2010/0276606, which document is hereby incorporated by reference in its entirety, may be used.

The aberration correctors may be CMOS based individual programmable deflectors as disclosed in EP2702595A1 or an array of multipole deflectors as disclosed EP2715768A2, of which the descriptions of the beamlet manipulators in both documents are hereby incorporated by reference.

In some embodiments, the objective lens referred to in earlier embodiments is an array objective lens. Each element in the array is a micro-lens operating a different beam or group of beams in the multi-beam. An electrostatic array objective lens has at least two plates each with a plurality of holes or apertures. The position of each hole in a plate corresponds to the position of a corresponding hole in the other plate. The corresponding holes operate in use on the same beam or group of beams in the multi-beam. A suitable example of a type of lens for each element in the array is a two-electrode decelerating lens. The bottom electrode of objective lens is a detector, for example a CMOS chip. The detector may be integrated into a multi-beam manipulator array such as the objective lens. Integration of a detector array into the objective lens replaces a secondary column. The detector array, e.g. the CMOS chip, is preferably orientated to face the sample (because of the small distance (e.g. 100 μm) between wafer and bottom of the electron-optical system). In some embodiments, electrodes to capture the secondary electron signals are formed in the top metal layer of the CMOS device. The electrodes can be formed in other layers. Power and control signals of the CMOS may be connected to the CMOS by through-silicon vias. For robustness, preferably the bottom electrode consists of two elements: the CMOS chip and a passive Si plate with holes. The plate shields the CMOS from high E-fields.

In order to maximize the detection efficiency it is desirable to make the electrode surface as large as possible, so that substantially all the area of the array objective lens (excepting the apertures) is occupied by electrodes and each electrode has a diameter substantially equal to the array pitch. In some embodiments, the outer shape of the electrode is a circle, but this can be made a square to maximize the detection area. Also the diameter of the through-substrate hole can be minimized. Typical size of the electron beam is in the order of 5 to 15 micron.

In some embodiments, a single electrode surrounds each aperture. In some embodiments, a plurality of electrode elements are provided around each aperture. The electrons captured by the electrode elements surrounding one aperture may be combined into a single signal or used to generate independent signals. The electrode elements may be divided radially (i.e. to form a plurality of concentric annuluses), angularly (i.e. to form a plurality of sector-like pieces), both radially and angularly or in any other convenient manner.

However a larger electrode surface leads to a larger parasitic capacitance, so a lower bandwidth. For this reason it may be desirable to limit the outer diameter of the electrode. Especially in case a larger electrode gives only a slightly larger detection efficiency, but a significantly larger capacitance. A circular (annular) electrode may provide a good compromise between collection efficiency and parasitic capacitance.

A larger outer diameter of the electrode may also lead to a larger crosstalk (sensitivity to the signal of a neighboring hole). This can also be a reason to make the electrode outer diameter smaller. Especially in case a larger electrode gives only a slightly larger detection efficiency, but a significantly larger crosstalk.

The back-scattered and/or secondary electron current collected by electrode is amplified by a Trans Impedance Amplifier.

Figure 7:
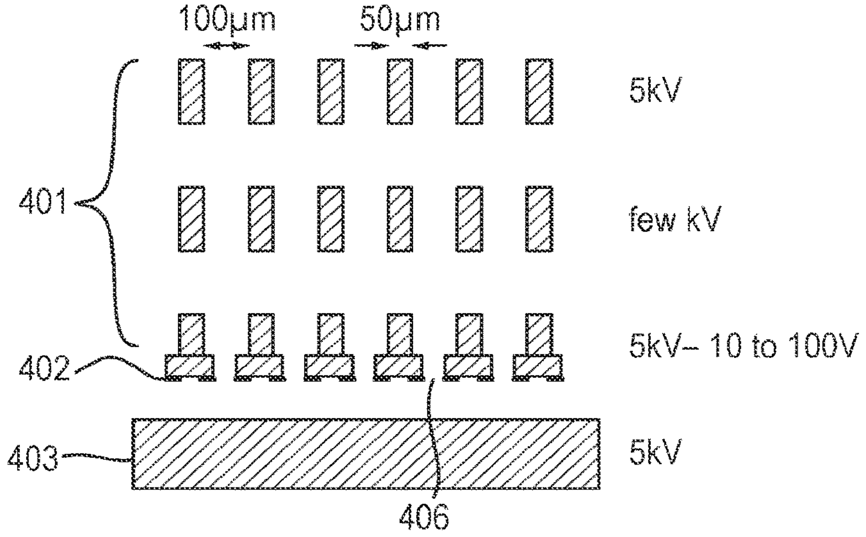
FIG. 7 is a schematic cross-sectional view of an objective lens of an inspection apparatus, according to some embodiments of the present disclosure.
Figure 8:
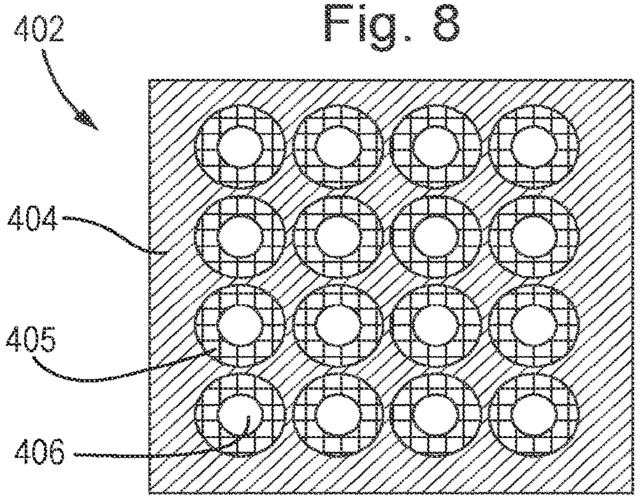
FIG. 8 is bottom view of the objective lens of FIG. 7.
Figure 9:
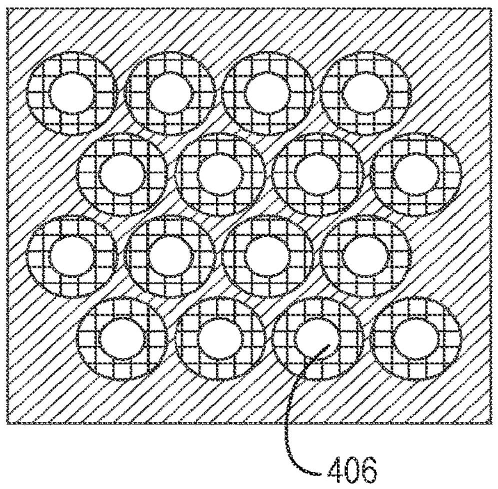
FIG. 9 is a bottom view of a modification of the objective lens of FIG. 7.

An example of a detector integrated into an objective lens array, is shown in FIG. 7 which illustrates a multibeam objective lens 401 in schematic cross section. On the output side of the objective lens 401, the side facing the sample 403, a detector module 402 is provided. FIG. 8 is a bottom view of detector module 402 which comprises a substrate 404 on which are provided a plurality of capture electrodes 405 each surrounding a beam aperture 406. The beam apertures 406 may be formed by etching through substrate 404. In the arrangement shown in FIG. 8, the beam apertures 406 are shown in a rectangular array. The beam apertures 406 can also be differently arranged, e.g. in a hexagonal close packed array as depicted in FIG. 9.

Figure 10:
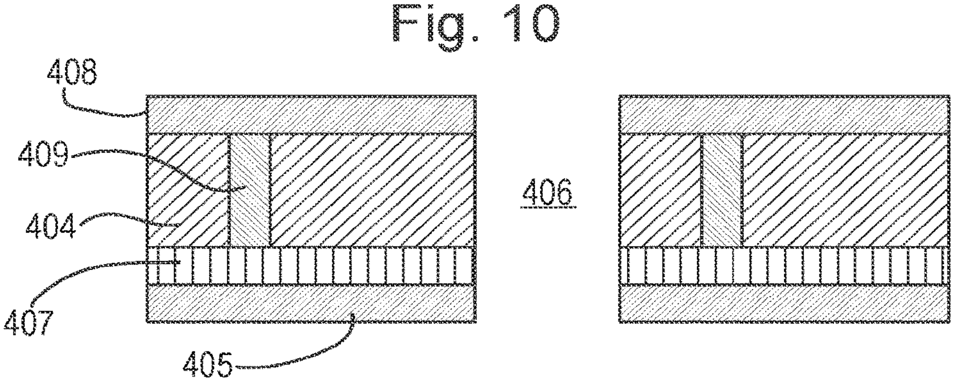
FIG. 10 is an enlarged schematic cross-sectional view of a detector incorporated in the objective lens of FIG. 7.

FIG. 10 depicts at a larger scale a part of the detector module 402 in cross section. Capture electrodes 405 form the bottommost, i.e. most close to the sample, surface of the detector module 402. Between the capture electrodes 405 and the main body of the silicon substrate 404 a logic layer 407 is provided. Logic layer 407 may include amplifiers, e.g. Trans Impedance Amplifiers, analogue to digital converters, and readout logic. In some embodiments, there is one amplifier and one analogue to digital converter per capture electrode 405. Logic layer 407 and capture electrodes 405 can be manufactured using a CMOS process with the capture electrodes 405 forming the final metallisation layer.

A wiring layer 408 is provided on the backside of substrate 404 and connected to the logic layer 407 by through-silicon vias 409. The number of through-silicon vias 409 need not be the same as the number of beam apertures 406. In particular if the electrode signals are digitized in the logic layer 407 only a small number of through-silicon vias may be required to provide a data bus. Wiring layer 408 can include control lines, data lines and power lines. It will be noted that in spite of the beam apertures 406 there is ample space for all necessary connections. The detection module 402 can also be fabricated using bipolar or other manufacturing techniques. A printed circuit board and/or other semiconductor chips may be provided on the backside of detector module 402.

The integrated detector array described above is particularly advantageous when used with a tool having tunable landing energy as secondary electron capture can be optimized for a range of landing energies. A detector array can also be integrated into other electrode arrays, not only the lowest electrode array.

An assessment tool according to some embodiments of the present disclosure may be a tool which makes a qualitative assessment of a sample (e.g. pass/fail), one which makes a quantitative measurement (e.g. the size of a feature) of a sample or one which generates an image of map of a sample. Examples of assessment tools are inspection tools (e.g. for identifying defects), review tools (e.g. for classifying defects) and metrology tools.

The terms "sub-beam" and "beamlet" are used interchangeably herein and are both understood to encompass any radiation beam derived from a parent radiation beam by dividing or splitting the parent radiation beam. The term "manipulator" is used to encompass any element which affects the path of a sub-beam or beamlet, such as a lens or deflector. The embodiments herein described may take the form of a series of aperture arrays or electron-optical elements arranged in arrays along a beam or a multi-beam path. Such electron-optical elements may be electrostatic. In some embodiments, all the electron-optical elements, for example from the beam limiting aperture array to the last electron-optical element in a sub-beam path before a sample, may be electro static and/or may be in the form of an aperture array or a plate array. In arrangement one or more of the electron-optical element may be manufactured as a microelectromechanical system (MEMS).

The term 'adjacent' may include the meaning to 'abut'.

Embodiments of the present disclosure are provided by the following clauses:

Clause 1: A charged-particle assessment tool comprising: a condenser lens array configured to divide a beam of charged particles into a plurality of sub-beams and to focus each of the sub-beams to a respective intermediate focus, a collimator at each intermediate focus, the collimators being configured to deflect a respective sub-beam so that it is incident on the sample substantially normally; a plurality of objective lenses, each configured to project one of the plurality of charged-particle beams onto a sample, wherein: each objective lens comprises: a first electrode; and a second electrode that is between the first electrode and the sample; and an electric power source configured to apply first and second potentials to the first and second electrodes respectively such that the respective charged-particle beam is decelerated to be incident on the sample with a desired landing energy.

Clause 2: A tool according to clause 1 wherein the first potential is more positive than the second potential.

Clause 3: A tool according to clause 1 or 2 wherein the second potential is positive relative to the sample, desirably in the range of from +50 V to +200 V relative to the sample.

Clause 4: A tool according to clause 1 or 2 wherein the second potential is positive relative to the sample, desirably in the range of +500 to +1,500 V relative to the sample.

Clause 5: A tool according to clause 1, 2, 3 or 4 wherein each objective lens further comprises a third electrode, the third electrode being between the first electrode and the charged-particle beam source; and the electric power source is configured to apply a third potential to the third electrode, preferably the electric power source is configured to apply different potentials to at least some of the first and second electrodes.

Clause 6: A tool according to any one of the preceding clauses further comprising a detector configured to detect charged particles emitted from the sample, the detector being between the plurality of objective lenses and the sample.

Clause 7: A tool according to any one of the preceding clauses wherein the electric power source is configured to apply the same first potential to all the first electrodes and the same second potential to all the second electrodes.

Clause 8: A tool according to any one of the preceding clauses further comprising one or more aberration correctors configured to reduce one or more aberrations in the sub-beams, preferably each of at least a subset of the aberration correctors is positioned in, or directly adjacent to, a respective one of the intermediate foci.

Clause 9: A tool according to any of the preceding clauses further comprising one or more scanning deflectors for scanning the sub-beams over the sample.

Clause 10: A tool according to clause 9, wherein the one or more scanning deflectors are integrated with, or are directly adjacent to, one or more of the objective lenses.

Clause 11: A tool according to any of the preceding clause, wherein the collimator is one or more collimator deflectors.

Clause 12: A tool according to clause 11, wherein the one or more collimator deflectors are configured to bend a respective beamlet by an amount effective to ensure that the principal ray of the sub-beam is incident on the sample substantially normally.

Clause 13: A tool according to any of the preceding clauses, the collimator at each intermediate focus comprises the collimators positioned in diverging paths of the sub-beams substantially at the position of the corresponding focus points of the sub-beam paths.

Clause 14: A tool according to any preceding clause, wherein the collimator is configured to operate on the respective diverging sub-beams so that down beam of the collimator to collimate the sub-beams with respect to each other.

Clause 15: An inspection method comprising: dividing a beam of charged particles into a plurality of sub-beams; focusing each of the sub-beams to a respective intermediate focus. Using a collimator at each intermediate focus to deflect a respective sub-beam so that it is incident on the sample substantially normally; and using a plurality of objective lenses to project the plurality of charged-particle beams onto the sample, each objective lens comprising a first electrode and a second electrode that is between the first electrode and the sample; and controlling electric potentials applied to the first and second electrodes of each objective lens such that the respective charged-particle beam is decelerated to be incident on the sample with a desired landing energy.

While the embodiments of the present disclosure have been described in connection with various examples, other embodiments will be apparent to those skilled in the art from consideration of the specification and practice of the technology disclosed herein. It is intended that the specification and examples be considered as exemplary only, with a true scope and spirit of the invention being indicated by the following claims.

The invention claimed is:

1. A charged-particle assessment tool comprising:

a condenser lens array configured to divide a beam of charged particles into a plurality of sub-beams and to focus each of the sub-beams to a respective intermediate focus;

a collimator at each intermediate focus, the collimators being configured to deflect a respective sub-beam so that it is incident on a sample substantially normally;

a plurality of objective lenses, each configured to project one of the plurality of sub-beams onto the sample, wherein:

each objective lens comprises:

a first electrode; and a second electrode that is between the first electrode and the sample;

an electric power source configured to apply first and second potentials to the first and second electrodes respectively such that the respective sub-beam is decelerated to be incident on the sample with a desired landing energy, and a detector configured to detect charged particles emitted from the sample, the detector being between the plurality of objective lenses and the sample.

2. The charged-particle assessment tool of claim 1, wherein the first potential is more positive than the second potential.

3. The charged-particle assessment tool of claim 1, wherein the second potential is positive relative to the sample.

4. The charged-particle assessment tool of claim 3, wherein the second potential is positive relative to the sample in a range of from +50 V to +200 V relative to the sample.

5. The charged-particle assessment tool of claim 1, wherein the second potential is positive relative to the sample, in a range of +500 to +1,500 V relative to the sample.

6. The charged-particle assessment tool of claim 1, wherein each objective lens further comprises a third electrode, the third electrode being between the first electrode and the condenser lens array; and the electric power source is configured to apply a third potential to the third electrode.

7. The charged-particle assessment tool of claim 6, wherein the electric power source is configured to apply different potentials to at least some of the first and second electrodes.

8. The charged-particle assessment tool of claim 1, wherein the electric power source is configured to apply the same first potential to all the first electrodes and the same second potential to all the second electrodes.

9. The charged-particle assessment tool of claim 1, further comprising one or more aberration correctors configured to reduce one or more aberrations in the sub-beams.

10. The charged-particle assessment tool of claim 9, wherein each of at least a subset of the aberration correctors is positioned in, or directly adjacent to, a respective one of the intermediate foci.

11. The charged-particle assessment tool of claim 1, further comprising one or more scanning deflectors for scanning the sub-beams over the sample.

12. The charged-particle assessment tool of claim 11, wherein the one or more scanning deflectors are integrated with, or are directly adjacent to, one or more of the objective lenses.

13. The charged-particle assessment tool of claim 1, wherein the collimator is one or more collimator deflectors.

14. The charged-particle assessment tool of claim 13, wherein the one or more collimator deflectors are configured to bend a respective beamlet by an amount effective to ensure that a principal ray of the sub-beam is incident on the sample substantially normally.

15. The charged-particle assessment tool of claim 1, wherein the collimator at each intermediate focus comprises the collimators positioned in diverging paths of the sub-beams substantially at the position of the corresponding focus points of the sub-beam paths.

16. The charged-particle assessment tool of claim 1, wherein the plurality of sub-beams comprises a plurality of diverging sub-beams, and the collimator is configured to operate on the plurality of diverging sub-beams to collimate the plurality of diverging sub-beams with respect to each other to produce a plurality of collimated sub-beams.

17. An inspection method comprising:

dividing a beam of charged particles into a plurality of sub-beams;

focusing each of the sub-beams to a respective intermediate focus;

using a collimator at each intermediate focus to deflect a respective sub-beam so that it is incident on a sample substantially normally;

using a plurality of objective lenses to project the plurality of sub-beams onto the sample, each objective lens comprising a first electrode and a second electrode that is between the first electrode and the sample;

controlling first and second electric potentials applied to the first and second electrodes respectively of each objective lens such that the respective sub-beam is decelerated to be incident on the sample with a desired landing energy, and using a detector to detect charged particles emitted from the sample, the detector being between the plurality of objective lenses and the sample.

18. The inspection method of claim 17, wherein in controlling the first and second electric potentials, the first potential is more positive than the second potential.

19. The inspection method of claim 17, wherein in controlling the first and second electric potentials, the second potential is positive relative to the sample.

* * * * *